(12) United States Patent
Goarin et al.

(10) Patent No.: US 7,923,363 B2
(45) Date of Patent: Apr. 12, 2011

(54) SONOS MEMORY DEVICE WITH OPTIMIZED SHALLOW TRENCH ISOLATION

(75) Inventors: Pierre Goarin, Leuven (BE); Robertus Theodorus Fransiscus Van Schaijk, Leuven (BE)

(73) Assignee: NXP B.V., Eindhoven (NL)

( * ) Notice: Subject to any disclaimer, the term of this patent is extended or adjusted under 35 U.S.C. 154(b) by 154 days.

(21) Appl. No.: 11/575,302

(22) PCT Filed: Sep. 13, 2005

(86) PCT No.: PCT/IB2005/052997
§ 371 (c)(1),
(2), (4) Date: Mar. 13, 2009

(87) PCT Pub. No.: WO2006/030380
PCT Pub. Date: Mar. 23, 2006

(65) Prior Publication Data
US 2009/0212347 A1     Aug. 27, 2009

(30) Foreign Application Priority Data
Sep. 15, 2004    (EP) .................................... 04104455

(51) Int. Cl.
*H01L 21/3205* (2006.01)
(52) U.S. Cl. ........ 438/591; 438/242; 438/248; 438/391; 438/700; 438/954; 257/E29.39; 257/E21.209

(58) Field of Classification Search .................. 438/242, 438/248, 591, 700; 365/53, 56
See application file for complete search history.

(56) References Cited

U.S. PATENT DOCUMENTS

| | | | |
|---|---|---|---|
| 6,677,639 B2* | 1/2004 | Lee et al. ........................ | 257/314 |
| 2002/0019113 A1 | 2/2002 | Chung | |
| 2003/0080370 A1* | 5/2003 | Harari et al. ................... | 257/314 |
| 2004/0004233 A1 | 1/2004 | Shum et al. | |
| 2004/0070034 A1* | 4/2004 | Park et al. ...................... | 257/380 |
| 2004/0180550 A1* | 9/2004 | Jeng .............................. | 438/700 |
| 2005/0127428 A1* | 6/2005 | Mokhlesi et al. ............. | 257/315 |

* cited by examiner

Primary Examiner — Charles Garber
Assistant Examiner — Yasser A Abdelaziez

(57) ABSTRACT

Method of manufacturing a non-volatile memory device on a semiconductor substrate in a memory area, said non-volatile memory device comprising a cell stack of a first semiconductor layer, a charge trapping layer and an electrically conductive layer, the charge trapping layer being the intermediate layer between the first semiconductor layer and the electrically conductive layer, the charge trapping layer comprising at least a first insulating layer; the method comprising: —providing the substrate having the first semiconductor layer; —depositing the charge trapping layer; —depositing the electrically conductive layer; —patterning the cell stack to form at least two non-volatile memory cells, and —creating a shallow trench isolation in between said at least two non-volatile memory cells.

11 Claims, 6 Drawing Sheets

SONOS MEMORY DEVICE WITH OPTIMIZED SHALLOW TRENCH ISOLATION

The present invention relates to a method of manufacturing a non-volatile memory device as defined in the preamble of claim 1. Further, the present invention relates to such a non-volatile memory device. Moreover, the present invention relates to an integrated circuit comprising at least one such non-volatile memory device.

SONOS memory devices comprise non-volatile memory cells built up of a stack of Semiconductor (silicon)Oxide (silicon)Nitride (silicon)Oxide Semiconductor, wherein the ONO part of the stack consists of, consecutively, a first silicon dioxide layer with a thickness of about 2 nm, a silicon nitride layer of about 6 nm and a second silicon dioxide layer of about 8 nm. The first silicon dioxide layer is located on a semiconductor (substrate) layer. On top of the second silicon dioxide layer a further semiconductor layer (e.g., polysilicon) is present.

The memory function of a SONOS device is based on the capability of the ONO stack to trap electric charge, which can be retained for long periods of time. Further, the presence of electric charge in the ONO stack can be manipulated relatively easily by charge injection and tunneling effects, which allows relatively simple programming and erasing of memory cells of this type.

However, the program and erasure operations are sensitive to thickness variations of the individual silicon dioxide and silicon nitride layers, in particular of the first silicon dioxide layer, since a variation of the layer thickness by about 0.2 nm may already seriously affect the program and erasure characteristics of the SONOS memory cell.

In the prior art, U.S. Pat. No. 6,403,486 discloses the use of shallow trench isolation (STI) for isolation of the individual SONOS memory cells relative to each other. Such a scheme of non self-aligned STI region formation which is substantially identical to that of floating gate flash memory cells may adversely affect the operation of SONOS memory cells, as will be explained with reference to FIGS. 1 and 2.

FIG. 1 shows diagrammatically a cross-section of a SONOS memory cell according to the prior art. A silicon substrate region 1 is electrically isolated from neighboring memory cells (not shown) by shallow trench isolation regions STI. The Si region and the STI regions are covered by an ONO layer stack 2, comprising the first silicon dioxide layer SD1, the silicon nitride layer SN and the second silicon dioxide layer SD2. On top of the ONO stack a poly-Si layer 3 is present. The construction of the SONOS memory cell closely resembles the layout of floating gate flash memory cells.

In the manufacturing process, a rounded edge of the channel region 4 near the interface of the Si region 1 and the ONO layer 2 is created due to the formation of the first silicon dioxide layer SD1 by thermal oxidation. The thermal oxidation process displays a different growth rate as a function of the crystallographic orientation of the Si region 1. Thus, the thickness of the first silicon dioxide layer SD1 in the vicinity of the STI regions differs from the thickness of the first silicon dioxide layer SD1 in the top-center of the Si region 1. FIG. 1a shows the variation of the thickness of the first silicon dioxide layer SD1 in more detail.

In flash memory, such a thickness variation of the first silicon dioxide is considered an advantage, since it improves the data (charge) retention of the flash memory cell. However, in SONOS memory cells such a variation of the thickness of the first silicon dioxide layer SD1 affects the electronic characteristics of the SONOS cell.

Note that in a silicon nitride layer SN the stored charge becomes localized, as opposed to the situation for standard flash memory where the charge is stored in poly-Si and a uniform potential is generated.

In FIG. 2 the current-voltage characteristics of a SONOS memory cell of the prior art before and after programming is shown.

FIG. 2 shows a first curve C1 of the source-drain current as a function of the control gate voltage of the memory cell for a SONOS memory cell in a pristine state, i.e., it has never (or at least not for a long period) been programmed and erased. Also shown is a second curve C2 of the source-drain current as a function of the control gate voltage of the memory cell for a SONOS memory cell after programming. Programming comprises a setting as known in the art: applying a +12V pulse on the gate for about 10 ms.

For a clear observation of the result, the SONOS memory cell used in the experiment shown in FIG. 2 has a width of 20 μm and a channel length of 0.2 μm.

In FIG. 2, furthermore two arrows A1 and A2 are shown, which indicate the effect of a reading operation caused by the localization of the charge stored in the silicon nitride layer SN.

The first arrow A1 indicates the read current contribution of a first transistor type which corresponds to a portion of the SONOS memory cell with the relatively thicker first silicon dioxide layer SD1, i.e., the edge region. The second arrow A2 indicates the read current contribution of a second transistor type which corresponds to a second portion of the SONOS memory cell with the relatively thinner first silicon dioxide layer SD1, i.e., the channel region 4.

Thus, to summarize, due to the thermal oxidation process mentioned above a local variation of the thickness of the first silicon dioxide layer SD1 results in a SONOS memory cell which comprises diagrammatically a circuit of first and second transistors connected in parallel. The circuit comprises "edge" transistors as indicated by first arrow A1 with a relatively lower threshold and "middle" transistors as indicated by the second arrow A2 with a relatively higher threshold.

A skilled person will appreciate that the behavior shown in FIG. 2 will adversely affect the operation of a memory cell equipped with an ONO stack.

It is therefore an object of the present invention to provide a method of manufacturing a non-volatile memory device on a semiconductor substrate in a memory area, which non-volatile memory device reduces the variation of the first silicon dioxide layer.

The present invention relates to a method of manufacturing a non-volatile memory device on a semiconductor substrate in a memory area said non-volatile memory device comprising a cell stack of a first semiconductor layer, a charge trapping layer and an electrically conductive layer, the charge trapping layer being the intermediate layer between the first semiconductor layer and the electrically conductive layer, the charge trapping layer comprising at least a first insulating layer; the method comprising:
  providing the substrate having the first semiconductor layer;
  depositing the charge trapping layer;
  depositing the electrically conductive layer;
  patterning the cell stack to form at least two non-volatile memory cells, and
  creating a shallow trench isolation in between said at least two non-volatile memory cells.

Advantageously, the method provides an optimization of the shallow trench formation which effectively reduces the variation of the thickness of the first silicon dioxide layer in the memory device equipped with an ONO stack, such as a SONOS memory device. Accordingly, the SONOS memory device fabricated by such method has better electronic characteristics than a SONOS memory device of the prior art.

Moreover, the present invention relates to a non-volatile memory device comprising a cell stack of a first semiconductor layer, a charge trapping layer and an electrically conductive layer, the charge trapping stack being the intermediate layer between the first semiconductor layer and the electrically conductive layer, the charge trapping layer comprising at least a first insulating layer; the cell stack being patterned to form at least two non-volatile memory cells; wherein a shallow trench isolation is provided in between said at least two non-volatile memory cells.

Also, the present invention relates to a semiconductor device comprising a SONOS non-volatile memory device as described above.

The invention will be explained in more detail below with reference to a few drawings in which illustrative embodiments thereof are shown. They are intended exclusively for illustrative purposes and not to restrict the inventive concept, which is defined by the claims.

Figure 1:
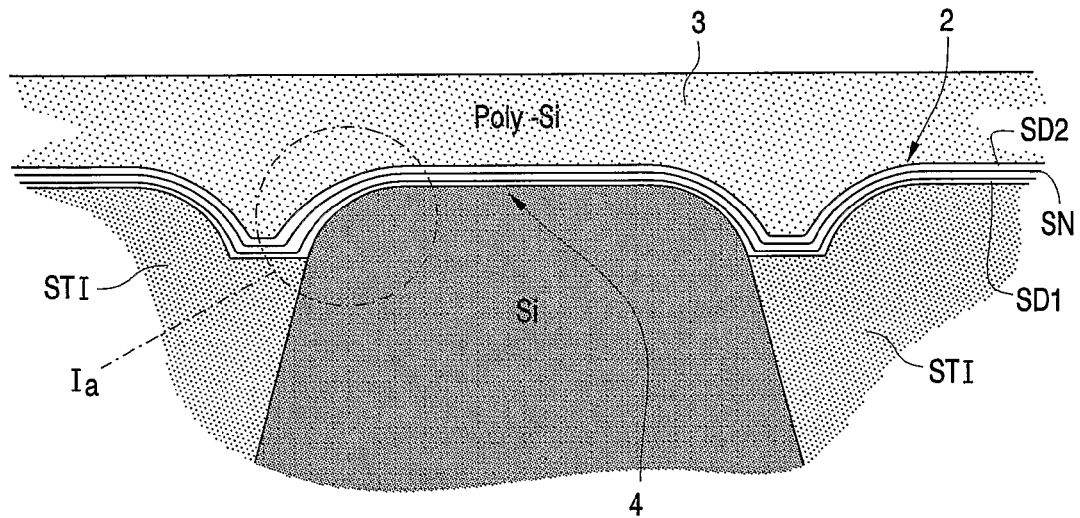
FIG. 1 shows diagrammatically a cross-section of a SONOS memory cell according to the prior art.
Figure 1A:
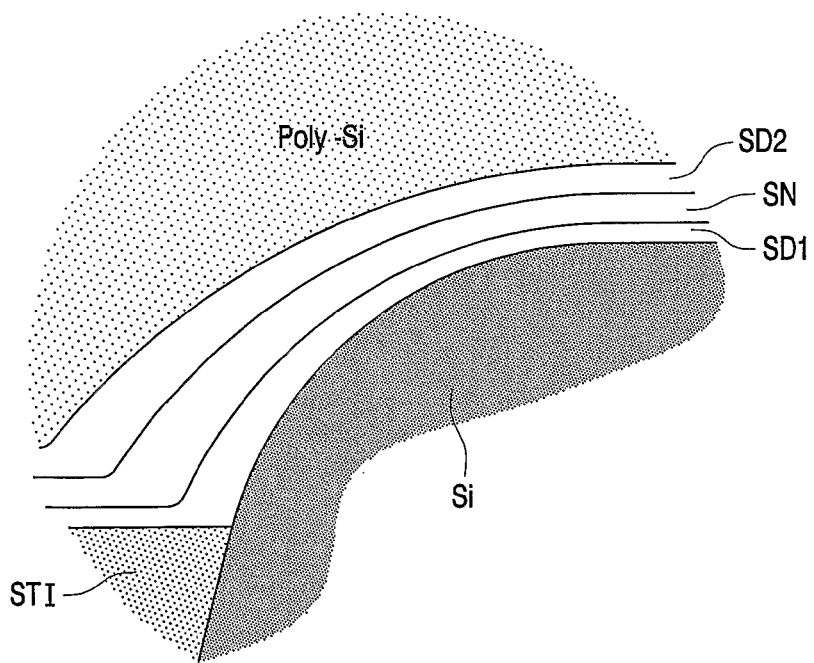
Figure 2:
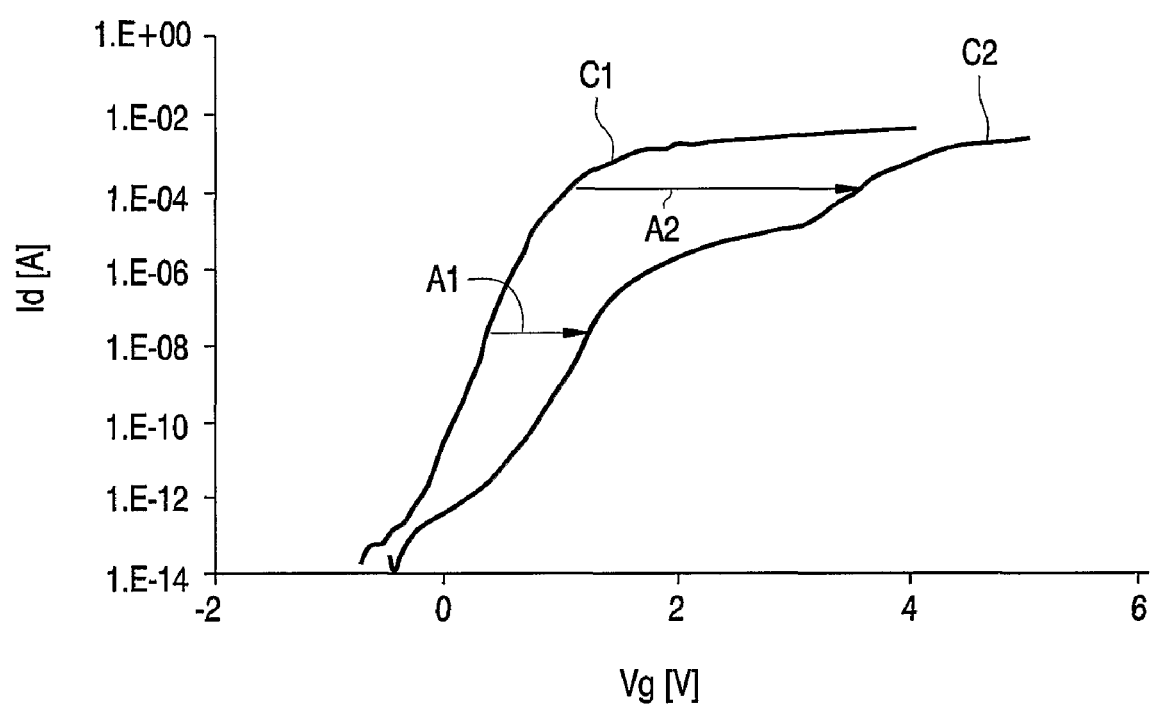
FIG. 2 shows current-voltage characteristics of a SONOS memory cell of the prior art before and after a programming operation.

For the purpose of teaching of the invention, preferred embodiments of the method and devices of the invention are described below. It will be appreciated by the person skilled in the art that other alternative and equivalent embodiments of the invention can be conceived and reduced to practice without departing form the true spirit of the invention, the scope of the invention being limited only by the appended claims.

Objects indicated by the same reference numerals relate to identical objects as shown in the preceding Figs.

Figure 3:
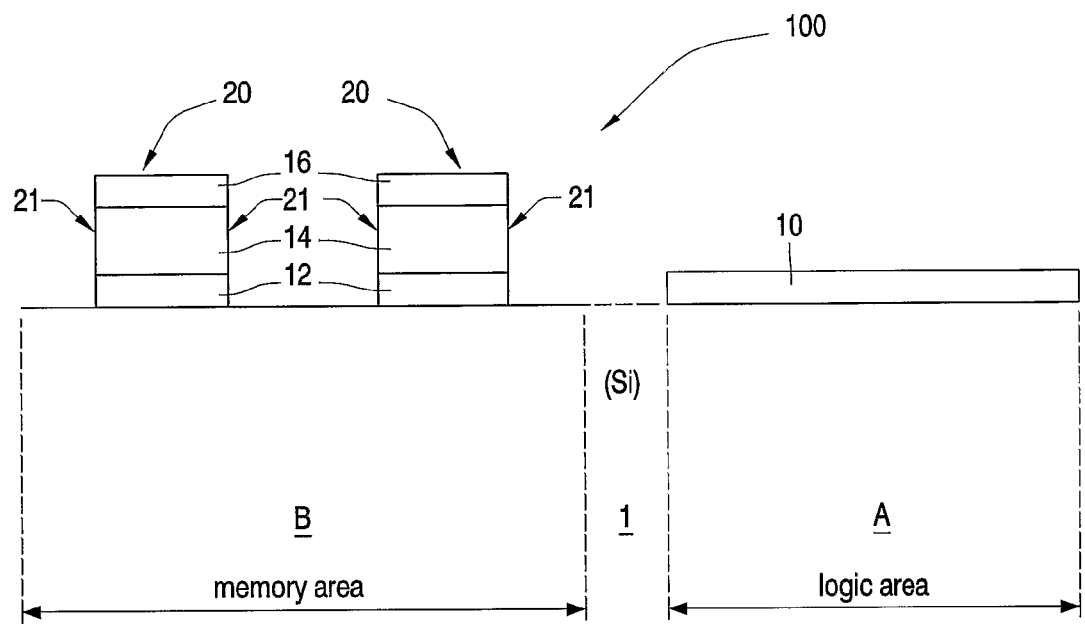
FIG. 3 shows diagrammatically a cross-section of a microelectronic device comprising a SONOS memory cell according to the present invention, at a first instance during the manufacturing.

FIG. 3 shows diagrammatically a cross-section of a microelectronic device comprising a SONOS memory cell according to the present invention, at a first instance during the manufacturing.

On a semiconductor substrate 1 a micro-electronic device 100 is created comprising a logic area A and a memory area B.

The logic area A will comprise device components that make up logic circuitry, the memory area B will comprise device components such as SONOS memory cells 20 that make up a memory circuitry (e.g., a memory array).

Logic area A is schematically indicated as a single region of the substrate 1 by vertical dashed lines. Memory area B is schematically indicated as a second single region of the substrate 1 by further vertical dashed lines. Between logic area A and memory area B a further region (not shown) may be present, which may contain further device components or circuitry for interfacing memory area B and logic area A.

During a first stage of manufacturing of such a microelectronic device 100 the following steps are carried out.

The semiconductor substrate 1 comprises a first semiconductor layer. On a surface of the first semiconductor layer of the semiconductor substrate 1 a sacrificial oxide 10 is formed.

Next, active areas (not shown) for device components of the circuits A and B (and others) are defined by ion implantation, as known in the art.

Subsequently, the sacrificial oxide 10 is removed from the memory area B and left on (at least) the logic area A.

Then, on memory area B, a charge trapping layer 12 is deposited. Such a charge trapping layer comprises at least a first insulating layer, for example a silicon dioxide layer. For example, the charge trapping layer 12 may be an oxide-nitride-oxide stack (ONO stack) comprising, on top of the first insulating layer, a silicon nitride layer and a second silicon dioxide layer. The present invention will be described below for an exemplary ONO stack as the charge trapping layer, but it is noted that other charge trapping layers comprising at least a first insulating layer may be applied as well.

The first silicon dioxide layer is formed preferably by thermal oxidation or by deposition of silicon dioxide. Typically, the first silicon dioxide layer has a thickness of about 1.5-3 nm, typically 2 nm. Both thickness and possible formation methods are well known to persons skilled in the art.

The silicon nitride layer may be formed by an LPCVD (Low pressure chemical vapor deposition) process or any other suitable deposition process. The thickness of the silicon nitride layer is in a range of about 4-8 nm, typically 6 nm.

The second silicon dioxide layer may be formed by an LPCVD process, such as HTO (high temperature oxide), or TEOS (tetra-ethyl-ortho-silicate), or any other suitable deposition technology. The second silicon dioxide layer has a thickness in a range of about 4-12 nm, typically 8 nm.

In a further step a poly-Si layer 14 is deposited by an LPCVD process. The thickness is within a range of about 30-100 nm, typically 50 nm.

It is noted that instead of a poly-Si layer, in general, an electrically conductive layer may be used for forming a control gate.

Next, a masking layer 16 is deposited comprising a first thin silicon dioxide layer and a subsequent silicon nitride layer. The thickness is within a range of about 5-20 nm for the thin silicon dioxide layer, typically 10 nm. For the silicon nitride cap layer the thickness is within a range of about 50-150 nm, typically 100 nm.

Then, after applying a resist pattern, a dry etch process is carried out to form separate line-shaped SONOS memory cells 20. Thus, a cell stack of a first semiconductor layer (i.e., Si substrate 1), a charge trapping stack 12 of silicon dioxide-silicon nitride-silicon dioxide and a second semiconductor layer (i.e., poly-Si layer 14) is created.

On the logic area A the stack of ONO 12, poly-Si 14 and nitride 16 is removed.

In FIG. 3, the length of the line-shaped SONOS memory cells 20 is perpendicular to the plane of the drawing.

The method of the present invention provides two preferred embodiments which equally solve the problem of the variation of the first silicon dioxide layer as encountered in methods of the prior art.

A first embodiment of the manufacturing method is explained with reference to FIGS. 4, 5 and 6. A second embodiment of the method will be explained with reference to FIG. 7.

Figure 4:
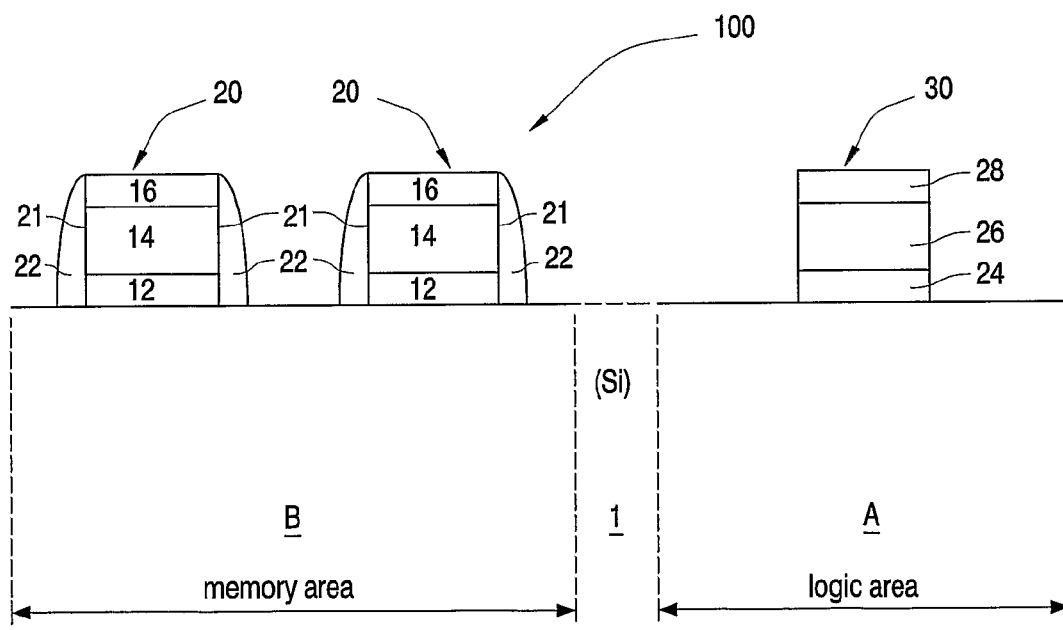
FIG. 4 shows diagrammatically the cross-section of the micro-electronic device according to a first embodiment of the manufacturing method, during a second instance.

FIG. 4 shows diagrammatically the cross-section of the micro-electronic device 100 according to a first embodiment of the manufacturing method, during a second instance.

In the following step, a thin silicon nitride layer is deposited by an LPCVD process. The thickness of the thin silicon nitride layer is about 5-50 nm.

Next, a spacer etch is performed on the thin silicon nitride layer to form nitride spacers 22 on the sidewalls 21 of the SONOS memory cells 20. Examples of spacer etch methods (i.e., anisotropic etching) are well known to persons skilled in the art.

Next, device components are to be formed on the logic area A. Such device components comprise MOSFET devices 30, of which the processing is described above by way of example.

To this end, the sacrificial oxide is removed from the logic area A, for example by a wet etch in diluted HF. The ONO layer 12 is protected by the spacers to withstand the HF oxide etch.

Next, a gate oxide 24 is grown on the logic area A by a well known thermal oxidation process. Note that the formation of "bird beaks" in the ONO layer is advantageously prevented by the spacers 22 as well.

After formation of the gate oxide 24, a poly-Si layer 26 is deposited. The MOSFET's poly-Si layer 26 is grown by LPCVD or any other suitable deposition technology known in the art.

Then, a capping layer 28 is deposited. The capping layer 28 may comprise silicon nitride, silicon-oxy-nitride (SiON), or an ONO stack. Preferably, the deposition of the capping layer 28 is preceded by deposition of a thin silicon dioxide layer (not shown). In some cases, the formation of the capping layer 28 may be omitted.

Typically, the MOSFET's poly-Si layer 26 has a thickness comparable to the thickness of the poly-Si layer 14 of the SONOS memory cell 20.

Then, a masking and dry etching step is performed to define the MOSFETs 30 on the logic area A.

Preferably, to prevent possible damage to the Si 1 surface, in the dry etch step the gate oxide layer 24 is used as a stopping layer in the exposed areas. The gate oxide layer in the exposed areas is then removed by a wet etch step.

Figure 5:
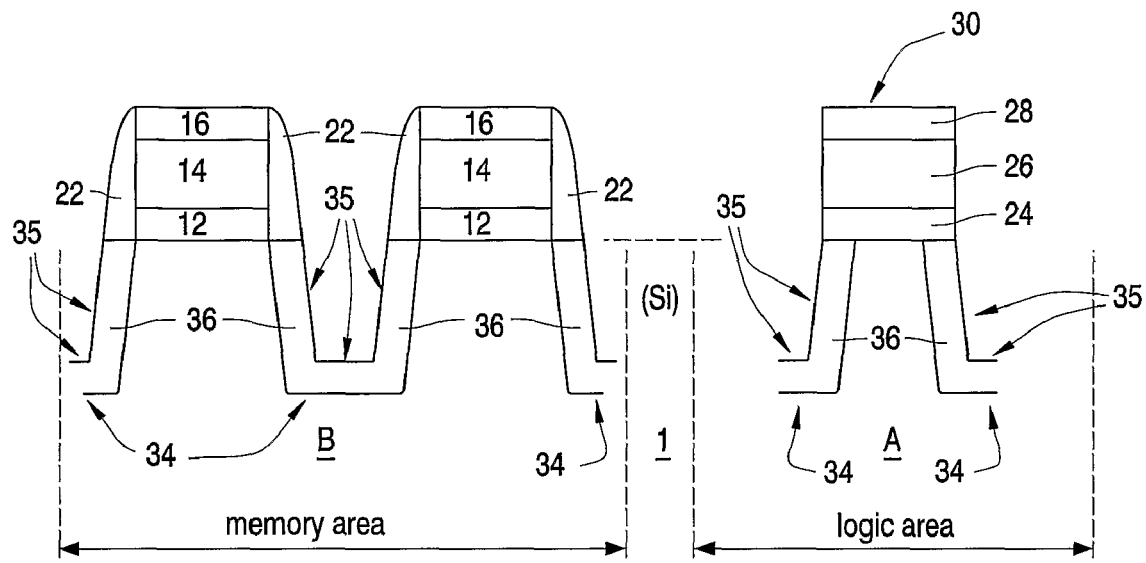
FIG. 5 shows diagrammatically a cross-section of the micro-electronic device, during a third instance.

FIG. 5 shows diagrammatically a cross-section of the micro-electronic device, during a third instance.

In the following steps, the isolation of SONOS memory cells 20 and MOSFETs 30 is accomplished by creating shallow trench isolation.

First, trenches are etched by a dry etching process which uses the nitride capping layers 16, 22 and 28 as masking layers. In all of the semiconductor surface areas that are not covered by the nitride capping layers 16, 22 and/or 28, trenches 34 will form. Note that the active areas (not shown) defined previously, are still covered by the nitride capping layers.

The trenches are etched to a depth of about 200-400 nm. The depth may however vary depending on, e.g., the design specifications of the micro-electronic device 100.

Next, a wet etch is carried out on the trench surface for cleaning and for removing Si damaged by the trench etching process.

Subsequently, the now bare Si surface 35 in the trenches 34 is exposed to a liner oxidation process which causes growth of a silicon dioxide liner 36 into the trench walls (by diffusion).

The liner oxidation process is critical for the present invention. The thickness of the silicon dioxide liner 36 must be substantially equal to the maximum thickness of silicon nitride spacer 22 as measured along the interface with the Si substrate 1. It is noted that the liner oxidation process will also create an oxide layer on the poly-Si gate (not shown in FIG. 6), but this does not adversely affect the processing steps as discussed here; no fundamental change of the processing steps is required due to the oxide layer on the poly-Si gate.

The liner oxidation process may be carried out by means of RTO (rapid thermal oxidation), a high temperature dry oxidation, or a high temperature wet oxidation process.

Figure 6:
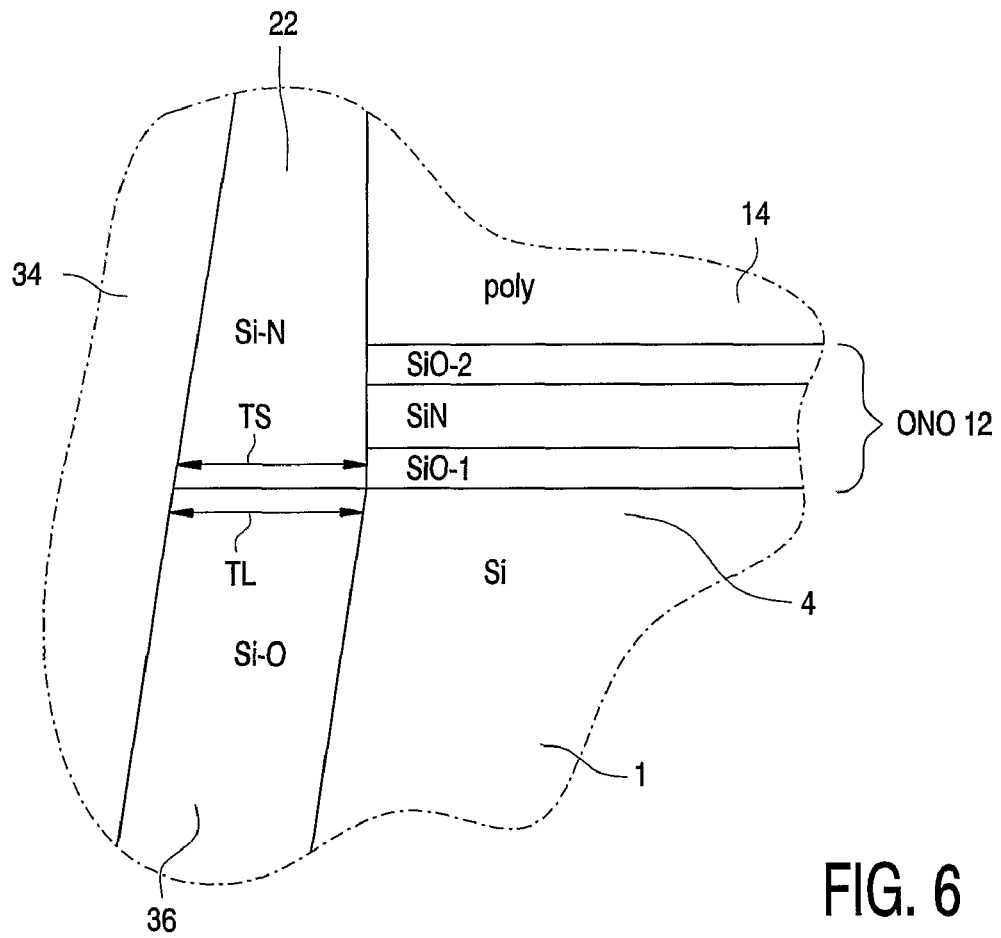
FIG. 6 shows diagrammatically a cross-section of a portion of the SONOS memory cell of the present invention according to the first embodiment.

FIG. 6 shows diagrammatically a cross-section of a portion of the SONOS memory cell of the present invention in accordance with the first embodiment. In FIG. 6 a corner portion of a SONOS memory cell 20 is shown to explain the characteristics of the liner oxidation process in more detail.

The portion of the SONOS memory cell 20 shows a part of the ONO stack 12, the base of the silicon nitride spacer 22, a part of the Si 1 below the ONO stack 12, a portion of the poly-Si layer 14 above the ONO stack 12, a part of the trench 34 and a portion of the silicon dioxide liner 36.

In ONO stack 12, the individual layers are shown (with reference to FIG. 4): the first silicon dioxide layer SiO-1 at the interface with the semiconductor Si substrate 1, then, on top of the first silicon dioxide layer SiO-1, the silicon nitride layer SiN and next, on top of the silicon nitride layer SiN, the second silicon dioxide layer SiO-2.

By virtue of the aforementioned application of spacer technology, each of the ONO layers SiO-1, SiN and SiO-2 has a constant thickness in the width direction (and in the length direction) of the SONOS memory cell 20. Thus, the problem of local variation of the thickness of the first silicon dioxide layer of the prior art is solved. However, as will be explained below, a thickness TL of the silicon dioxide liner 36 must be tuned carefully with respect to a thickness TS of the spacer 22 along the interface with the Si substrate 1.

If the thickness TL of the silicon dioxide liner 36 were substantially less than the thickness TS of the spacer 22, some free Si under the spacer 22 would remain. This free Si would create a surplus resistor parallel to the channel region 4 (perpendicular to the plane of the drawing).

If the thickness TL of the silicon dioxide liner 36 were substantially larger than the thickness TS of the spacer 22, the silicon dioxide liner 36 would extend below the first silicon dioxide layer SiO-1. This extension of the silicon dioxide liner 36 would create a local change of the thickness of the first silicon dioxide layer SiO-1 and again create the problem of the prior art, i.e., local variation of the electronic properties of the SONOS memory cell 20.

Figure 7:
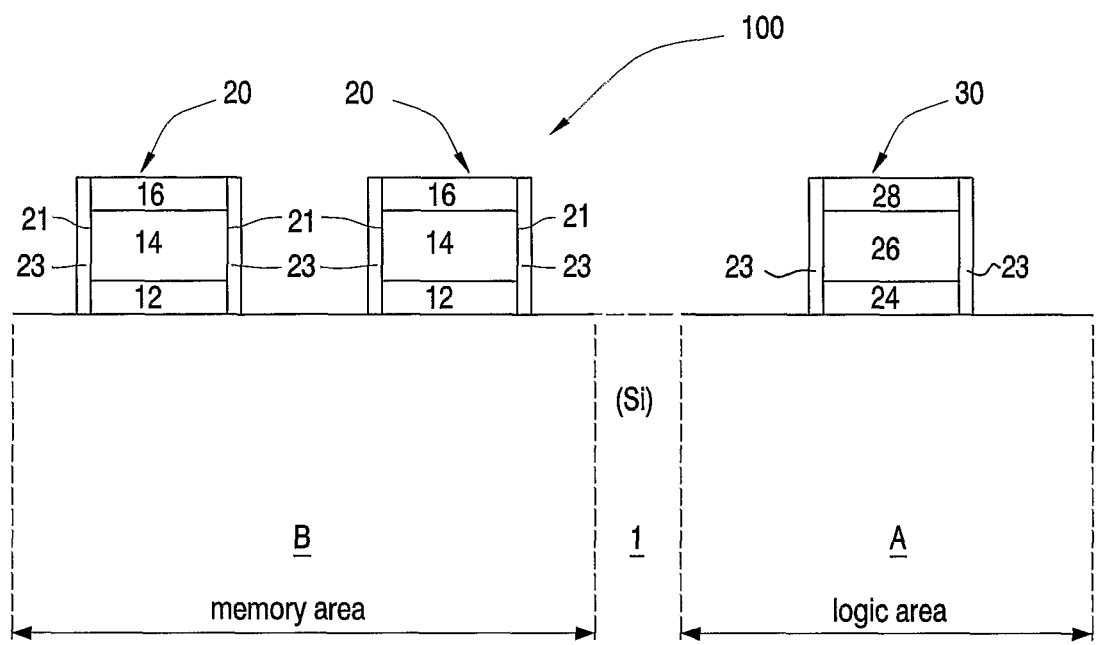
FIG. 7 shows diagrammatically the cross-section of the micro-electronic device 100 according to a second embodiment of the manufacturing method, during a second instance.

FIG. 7 shows diagrammatically the cross-section of the micro-electronic device 100 according to a second embodiment of the manufacturing method, during a second instance.

Objects with the same reference numerals as in the preceding Figs. relate to the same objects.

After formation of SONOS memory cells 20 in the memory area B, in a similar manner as described with reference to FIG. 4, a protective layer 23 (a nitrogen-enriched or nitrogen-stuffed layer) is created on the sidewalls 21 of the SONOS memory cells 20. The protective layer 23 is formed by a plasma nitridation process or a nitrogen implantation process. Both processes are well known to persons skilled in the art.

The protective layer 23 is capable of preventing further growth of the first (and second) silicon dioxide layer SiO-1, SiO-2 at the sidewalls 21 during further processing of the micro-electronic device 100.

Note that in a further embodiment, after the formation of SONOS memory cells 20 in the memory area B, in a similar manner as described with reference to FIG. 4 for the second embodiment, an additional silicon etch into the substrate is performed. The depth is within a range of 10-50 nm, typically 30 nm. This allows the liner oxidation after etching of the STI trenches 34. Next, the plasma nitridation process or nitrogen implantation process is carried out. The protective layer 23 is now also present on the trench walls and prevents oxidation of the upper part of the trench, close to the channel region 4. Further, the protective layer 23 keeps the liner oxide away from the ONO layer. But the liner oxide is still present in the lower part of the trench to prevent (junction) leakage.

It is also considered that, optionally, the additional Si etch can also be carried out in the first embodiment after the formation of the SONOS memory cells 20 as shown in FIG. 4.

Next, the components in the logic area A, such as MOS-FETs 30, can be formed while the first and second silicon dioxide layers remain substantially unaltered. Creation of the components in the logic area A is carried out as described above.

Figure 8:
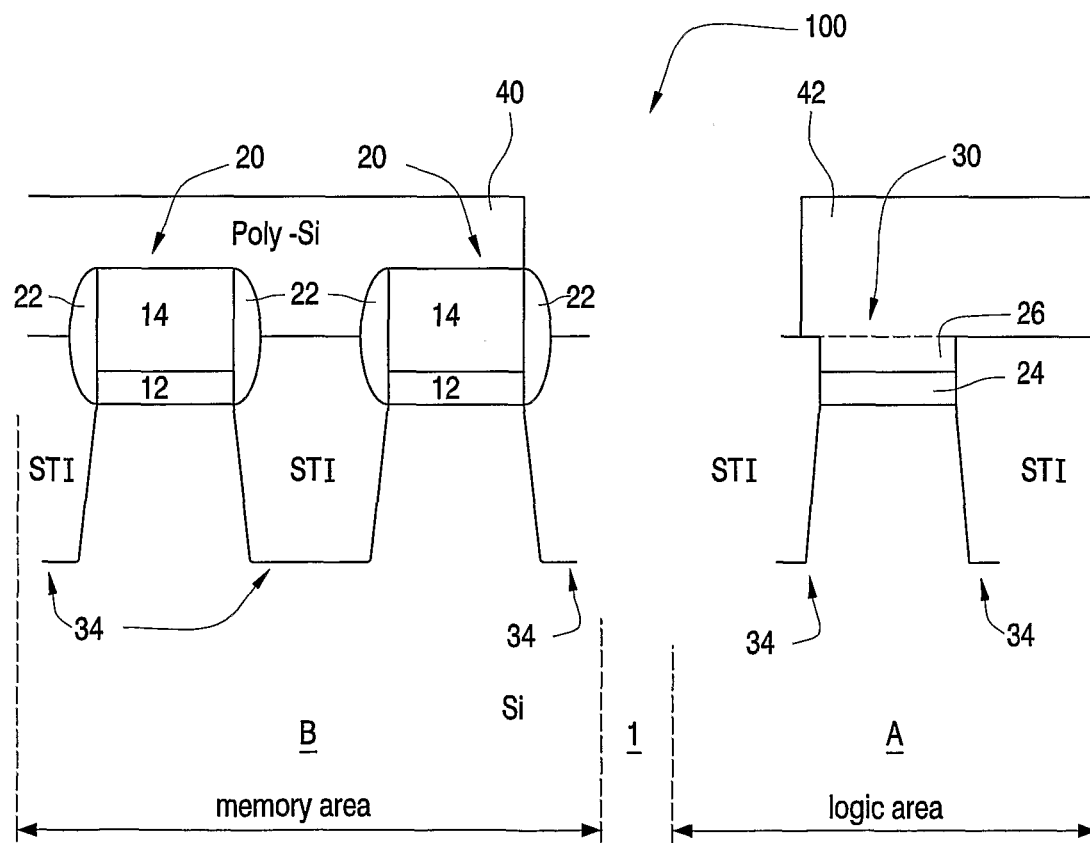
FIG. 8 shows diagrammatically a cross-section of the micro-electronic device, during a further instance.

FIG. 8 shows diagrammatically a cross-section of the micro-electronic device, at a further instance during manufacturing according to each of the embodiments. In FIG. 8 the completion of the micro-electronic device 100 up to the metallization step is shown.

First, a trench fill process is carried out. Trenches 34 are filled with an STI/HDP-oxide by means of a PECVD process to form shallow trench isolations STI. Preferably, the micro-electronic device is created by the method according to the first embodiment.

Note that in the case of the second embodiment, which applies the nitrogen-enriched protective layer 23, the sidewalls 35 of the trenches 34 are cleaned prior to the filling of the trenches 34 with STI/HDP oxide.

Note further that instead of HDP oxide other dielectric materials may be applied.

Next, a planarization process is performed, which uses the nitride capping layers 16, 28 as stopping layers.

Then, optionally, the STI/HDP-oxide is exposed to a HF dip to reduce the surface level of the HDP-oxide relative to the surface level of the nitride capping layers 16, 28.

Subsequently, the nitride capping layers 16, 28 are removed by a wet etch process. In this case, the thin silicon dioxide layer deposited immediately before deposition of the silicon nitride layers 16, 28 may advantageously function as a stopping layer.

It is noted that the order of wet etch removal steps for STI/HDP-oxide and silicon nitride layers may be reversed, although this may affect the results somewhat adversely due to the possible presence of mechanical stress in the oxide and/or nitride layers.

Further, the poly-Si layers 14 of the SONOS memory cell 20 and the poly-Si layers 26 of the MOSFET 30 are cleaned.

Next, a poly-Si connect layer is deposited. Other suitable conductive materials may be applied, as known to persons skilled in the art.

By masking and etching, first poly-Si lines 40 on the memory area B and second poly-Si lines 42 on the logic area A are created. The second silicon dioxide layer SiO-2 may act as stopping layer for the poly-Si etching process. If needed, the second silicon dioxide layer SiO-2 is removed by a wet etch, e.g., an HF dip. (The nitride layer can be removed by e.g., phosphoric acid, and the first silicon oxide layer with a short HF dip. Or the complete ONO stack can be removed by dry etching, after the poly-Si etch.)

The first poly-Si lines 40 form word-lines on the SONOS memory cells 20. The second poly-Si lines 42 may be required for forming connections on the gate 24, 26 of the MOSFET 30.

Figure 9:
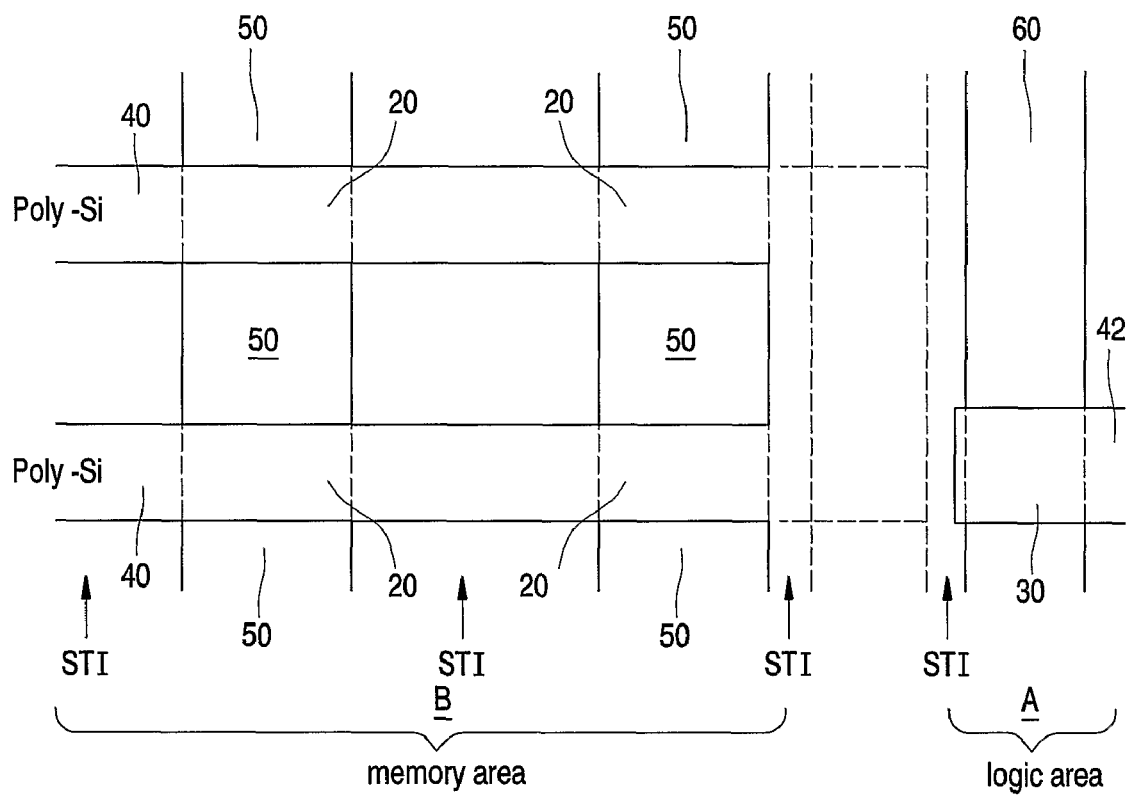
FIG. 9 shows diagrammatically a top view of the micro-electronic device.

FIG. 9 shows diagrammatically a top view of the micro-electronic device.

On the memory area B, by way of example four SONOS memory cells 20 are shown. Trenches STI extend in the vertical direction and separate areas 50 on which bit-lines (not shown) can be implemented.

The first poly-Si lines 40 extend in the horizontal direction, and cross over the SONOS memory cells 20.

On the logic area A, a single second poly-Si line 42 is shown, crossing over a MOSFET 30. A line 60 extends in the vertical direction, in between two parallel trenches STI extending in the same direction.

Further processing as known to persons skilled in the art may be carried out to complete the micro-electronic device 100. Standard processes for forming spacers on the first and second poly-Si lines 40, 42 are applied. Source and drain areas are created over the previously defined active areas. After that, silicidation of source, drain and gate areas may be carried out, followed by e.g., deposition of a passivation layer, creation of vias, and metallization.

It is noted that in FIG. 3 processing starts on the logic area A by creating the sacrificial layer 10, which is subsequently removed from the memory area B. After the removal, the ONO stack is formed. The formation order may be reversed, however, by first forming the ONO stack 12 on the substrate 1 and subsequently, after removal of the ONO stack 12 from the logic area A, forming a sacrificial layer on that logic area A. This involves additional etching of the ONO stack, which is relatively complex in particular for the silicon nitride layer. Nevertheless, after removal of the ONO stack the gate oxide can be grown. Then one poly-Si deposition and one capping layer deposition is required. Gates in memory area B and logic area A can be defined at the same time. Successively, the nitride spacers 22 are formed. Here, a further mask is needed for removal of the silicon nitride layer (for the spacers 22) from the logic area A. Again, this removal of silicon nitride can be done by a wet etch.

Further, the optimization of the spacer formation can also be used in stand-alone memories comprising non-volatile memories of the SONOS type.

Also, for stand-alone memories a further simplification is allowed: thermal oxidation to create silicon dioxide liners 35 in the trenches 34 is not needed if the spacers may be omitted. Immediately after etching of the cell stack 12, 14, 16, trenches 34 can be etched and filled with STI/HDP oxide. For embedded memories this simplification may also be allowed if (junction) leakage is not important or, as such, low enough to omit the formation of a liner oxide.

Moreover, it is conceivable that the trench depth to be used in the memory area B differs from the trench depth as used in the logic area A. This may be achieved by providing an additional mask, after the deposition of the capping layer 28, on the MOSFETs 30. This additional mask serves as a protection layer on the logic area A. Then, the trenches 34 in the memory area B are etched to a first depth. Next, the additional mask on the logic area A is removed (stripped) and the trench etch is continued to a second depth. On the memory area B the trench etch of the first depth and of the second depth accumulate and result in a total depth that is larger than the depth of the trenches in the logic area A, which is equal to just the second depth.

In CMOS applications the option to have relatively shallow trenches in the logic area A (with a smaller depth in the logic area A than in the memory area B) can be advantageous. In the logic area A the trench width may be relative small compared to the trench width in the memory area B. Thus, for a constant trench depth in both memory and logic areas the aspect ratio of the trenches in the logic area is higher than in the memory area. In that case, filling the trenches in the logic area with HDP oxide may prove to be more difficult than for trenches in the memory area.

The invention claimed is:

1. Method of manufacturing a non-volatile memory device on a semiconductor substrate in a memory area said non-volatile memory device comprising a cell stack including a first semiconductor layer, a charge trapping layer and an electrically conductive layer, the charge trapping layer being the intermediate layer between the first semiconductor layer and the electrically conductive layer, the charge trapping layer comprising at least a first oxide layer; the method comprising:
    providing the substrate having the first semiconductor layer;
    depositing the charge trapping layer;
    depositing the electrically conductive layer;
    creating a protective layer on sidewalls of at least the charge trapping layer comprising at least the first oxide layer;
    patterning the cell stack to form at least two non-volatile memory cells; and
    after at least deposition of the charge trapping layer and creation of the protective layer, creating a shallow trench isolation in between said at least two nonvolatile memory cells;
    wherein the protective layer is arranged for preventing a local change of a thickness of the first insulating layer at or near the sidewalls during a further processing step.

2. Method of manufacturing a non-volatile memory device according to claim 1 on a semiconductor substrate in a memory area, wherein the protective layer is a nitrogen-enriched layer formed by a plasma-nitridation process or a nitrogen implantation process.

3. Method of manufacturing a non-volatile memory device according to claim 1 on a semiconductor substrate in a memory area, wherein the protective layer is a spacer formed by deposition of a thin silicon nitride layer and a subsequent spacer etch process.

4. Method of manufacturing a non-volatile memory device according to claim 3 on a semiconductor substrate in a memory area, wherein the spacer has a spacer thickness along the surface of the first semiconductor layer; said step of creating said shallow trench isolation comprises the formation of trenches in between said at least two non-volatile memory cells, the trenches comprising trench walls in said semiconductor substrate, and the method further comprises:
    thermally oxidizing the trench walls to obtain a silicon dioxide liner on said trench walls, the silicon dioxide liner having a liner thickness along the surface of the first semiconductor layer, the thermal oxidation being carried out in such a way that the liner thickness substantially equals the spacer thickness.

5. Method of manufacturing a non-volatile memory device according to any one of the preceding claims on a semiconductor substrate in a memory area, wherein the semiconductor substrate further comprises a logic area, and the method further comprises:
    forming components on said logic area, said memory cell meanwhile being protected by said protective layer.

6. Method of manufacturing a non-volatile memory device according to any one of the preceding claims on a semiconductor substrate in a memory area, wherein the method further comprises:
    filling the trenches with a dielectric material;
    planarizing the dielectric material;
    depositing a connect layer;
    patterning the connect layer to provide first conductive lines on the nonvolatile memory cells;
    providing a metallization pattern and a passivation layer.

7. Method of manufacturing a non-volatile memory device according to claim 6 on a semiconductor substrate in a memory area, wherein said patterning of the connect layer also comprises providing second conductive lines on the components in the logic area.

8. Method of manufacturing a non-volatile memory device according to claim 1 on a semiconductor substrate in a memory area, wherein the charge trapping layer is an Oxide-Nitride-Oxide (ONO) stack including a first silicon oxide layer, a silicon nitride layer, and a second silicon oxide layer.

9. A non-volatile memory device comprising:
    a cell stack including a first semiconductor layer, a charge trapping layer and an electrically conductive layer, the charge trapping layer being the intermediate layer between the first semiconductor layer and the electrically conductive layer, the charge trapping layer comprising at least a first insulating layer, the cell stack being patterned to form a trench between at least two non-volatile memory cells;
    a protective layer on sidewalls of said cell stack;
    a liner on walls of said trench;
    a shallow trench isolation provided in said trench;
    wherein the thickness of said protective layer is substantially equal to the thickness of the liner.

10. Semiconductor device comprising at least a non-volatile memory device according to claim 9.

11. The Method of manufacturing a non-volatile memory device according to claim 8, wherein the protective layer is created on sidewalls of the first silicon oxide layer, on sidewalls of the silicon nitride layer, and on sidewalls of the second silicon oxide layer.

* * * * *